(12) United States Patent
Nishimura et al.

(10) Patent No.: US 7,683,714 B2
(45) Date of Patent: Mar. 23, 2010

(54) DIFFERENTIAL AMPLIFIER AND DISPLAY DEVICE USING THE SAME

(75) Inventors: Kouichi Nishimura, Kanagawa (JP); Atsushi Shimatani, Kanagawa (JP); Toshikazu Murata, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 185 days.

(21) Appl. No.: 11/645,612

(22) Filed: Dec. 27, 2006

(65) Prior Publication Data

US 2007/0159249 A1    Jul. 12, 2007

(30) Foreign Application Priority Data

Dec. 28, 2005  (JP)  .............................. 2005-378576
Dec. 22, 2006  (JP)  .............................. 2006-345334

(51) Int. Cl.
*H03F 3/45*   (2006.01)
(52) U.S. Cl. ...................................... 330/253
(58) Field of Classification Search ................... 330/68, 330/252–261; 345/204
See application file for complete search history.

(56) References Cited

U.S. PATENT DOCUMENTS

| 4,570,128 | A |   | 2/1986 | Monticelli |  |
|---|---|---|---|---|---|
| 5,311,145 | A |   | 5/1994 | Huijsing et al. |  |
| 5,699,015 | A | * | 12/1997 | Dotson et al. | 330/255 |
| 5,808,513 | A | * | 9/1998 | Archer | 330/253 |
| 6,300,833 | B1 | * | 10/2001 | Vyne et al. | 330/257 |
| 7,262,662 | B2 | * | 8/2007 | Adachi | 330/259 |
| 2002/0053948 | A1 | * | 5/2002 | Stockstad | 330/253 |
| 2003/0030603 | A1 | * | 2/2003 | Shimoda | 345/76 |

FOREIGN PATENT DOCUMENTS

| JP | 6-91379 | 11/1994 |
|---|---|---|
| JP | 6-326529 | 11/1994 |

OTHER PUBLICATIONS

Dr. Lynn, PMOS Process Details, Jun. 4, 2002, Rochester Institute of Technology Microelectronic Engineer, pp. 1-51.*

* cited by examiner

*Primary Examiner*—Robert Pascal
*Assistant Examiner*—Khiem D Nguyen
(74) *Attorney, Agent, or Firm*—McGinn IP Law Group, PLLC

(57) ABSTRACT

Disclosed is a differential amplifier which comprises a differential pair comprising depletion-type first and second N-channel MOS transistors, a first current source that supplies a current for the differential pair, a current mirror circuit formed by transistor pairs connected in cascode fashion in two stages, for connecting an output pair of the differential pair in folded connection, second and third current sources connected to an input terminal of the current mirror circuit and an output terminal of the current circuit, respectively, and a buffer amplifier with that has an input terminal connected to the output terminal of the current mirror circuit and has an output terminal connected to an output terminal of the differential amplifier.

19 Claims, 10 Drawing Sheets

AMPLITUDE DIFFERENCE DEVIATION WHEN AMP OF THE PRESENT INVENTION HAS BEEN USED

AMPLITUDE DIFFERENCE DEVIATION WHEN CONVENTIONAL AMP HAS BEEN USED

US 7,683,714 B2

DIFFERENTIAL AMPLIFIER AND DISPLAY DEVICE USING THE SAME

FIELD OF THE INVENTION

The present invention relates to a differential amplifier. More specifically, the invention relates to a configuration of a differential amplifier suitable for use as a drive amplifier for a data driver of a liquid crystal display device or the like and a display device including the differential amplifier.

BACKGROUND OF THE INVENTION

In recent years, a reduction in the cost of color display devices has been achieved. Accompanying the cost reduction, the cost of LCD (Liquid Crystal Display) source drivers has reduced to almost a third during these ten years, and a demand for further cost reduction has been increasing. In order to satisfy the demand as described above, reduction in a chip size of an LSI of the LCD source driver is planned in research, product design, and the like. It is because the most effective means for the cost reduction is the chip size reduction.

The number of gray scales has been increased, and a transition is made from display of 260 thousand colors with six bits for each of RGB to display of 16700 thousand colors with eight bits for each of RGB, for example. Further, a product that displays one billion colors with ten bits for each of RGB has been on the market. For this reason, high accuracy of output buffer amplifiers in the LCD source driver, each of which is composed by a differential amplifier, is demanded. When an output deviation of the LCD source driver exceeds 10 mV, the deviation is recognized by a human eye and appears as a display defect such as a vertical streak. As described above, it is necessary to cope with two contradictory demands for cost reduction and high accuracy.

A configuration of differential amplifiers that occupy a lot in the area of the LCD source driver LSI greatly influences the cost reduction and the high accuracy. A typical LCD source driver will be described below.

FIG. 1 is a diagram showing a typical configuration of a conventional LCD source driver (also referred to as a "data driver"). Referring to FIG. 1, this LCD source driver is constituted from a data register 1 that samples signals R, G, and B each being a six-bit digital display signal, a latch circuit 2 that latches six-bit digital signals in synchronization with a strobe signal ST, a D/A converter 3 constituted from N parallel stages of digital/analog converters, a liquid crystal gray scale voltage generation circuit 4 that has a gamma-conversion characteristic adjusted to liquid crystal characteristics, and N voltage followers 5 that perform buffering of voltages from the D/A converter 3, respectively.

An LCD panel is provided for intersections between data lines and scan lines, and is constituted from thin-film transistors TFTs (Thin Film Transistors) 6 and pixel capacitances 7. Gates of the TFTs 6 are connected to the scan lines, respectively, and sources of the TFTs 6 are connected to the data lines, respectively. One ends of the pixel capacitances 7 are connected to drains of the TFTs, and the other ends of the pixel capacitances 7 are connected to a COM terminal.

FIG. 1 schematically shows a configuration of one row on the LCD panel (on which a plurality (M) of rows each constituted from N thin-film transistors (TFTs) are provided).

An LCD gate driver not shown sequentially drives gates of the TFTs in respective lines.

The D/A converter 3 performs D/A conversion of the six-bit digital display signals from the latch circuit 2 and supplies the resulting signals to N voltage followers 5-1 to 5-n, respectively, for application to liquid crystals that serve as pixel capacitances 7-1 to 7-N through TFTs 6-1 to 6-N, respectively.

Reference voltages are generated by the liquid crystal gray scale voltage generation circuit 4, and reference voltage selection is performed by a decoder constituted from a ROM switch or the like in the D/A converter 3.

The liquid crystal gray scale voltage generation circuit 4 has a resistor ladder circuit, for example. The resistor ladder circuit is driven by the voltage followers in order to reduce impedance at each reference voltage point or to make fine adjustment of the reference voltages.

As a circuit of each of the N voltage followers 5-1 to 5-N, an operational amplifier circuit having a circuit configuration as shown in FIG. 2, for example, is employed. FIG. 2 is a diagram showing the configuration of a differential amplifier disclosed in Patent Document 1. This differential amplifier is a so-called rail-to-rail amplifier, and is described in a text book or well known literature on CMOS analog circuits as a reference circuit.

Referring to FIG. 2, a differential stage includes a differential pair (MN1, MN2) of N-channel MOS transistors and a differential pair (MP1, MP2) of P-channel MOS transistors in order to achieve a rail-to-rail operation. Outputs of the differential pair (MN1, MN2) are connected to points A and B, respectively, and outputs of the differential pair (MP1, MP2) are connected to points C and D, respectively, in order to add currents of the outputs of the differential pairs (MN1, MN2) and (MP1, MP2). The points A, B, C, and D are the points in a so called folded-cascode connections. In a range where the differential pair (MP1, MP2) does not operate, the differential pair (MN1, MN2) operates, while, in a range where the differential pair (MN1, MN2) does not operate, the differential pair (MP1, MP2) operates. The differential stage that operates over an input range of all supply voltages can be thereby obtained. With regard to an operation of the circuit in FIG. 2, Patent Document 1, Patent Document 2, and the like is referred to. The circuit in FIG. 2 will be further described below.

Referring to FIG. 2, the circuit configuration of this differential amplifier is broadly divided into three: an input (initial) stage 210, an intermediate stage 220, and a final stage 230.

The input stage 210 is constituted from the two differential pairs (MN1, MN2) and (MP1, MP2). Sources of the N-channel MOS transistors MN1 and MN2 are coupled in common to constitute a first differential pair (also referred to as an "N-channel differential pair"). An N-channel MOS transistor MN10 is connected between the first differential pair and a negative power supply (low-potential power supply) VSS2. The N-channel MOS transistor MN10 has a source connected to the negative power supply VSS2, a drain connected to the commonly coupled sources of the N-channel MOS transistors MN1 and MN2, and a gate connected to a constant voltage source terminal BN1 and serves as a constant current source. Sources of the P-channel MOS transistors MP1 and MP2 are coupled in common to constitute a second differential pair (also referred to as a "P-channel differential pair"). A P-channel MOS transistor MP10 is connected between the second differential pair and a positive power supply (high-potential power supply) VDD2. The P-channel MOS transistor MP10 has a source connected to the positive power supply VDD2, a drain connected to the commonly coupled sources of the P-channel MOS transistors MP1 and MP2, and a gate connected to a constant voltage source terminal BP1, and serves as a constant current source. Gates of the P-channel MOS transistor MP1 and the N-channel MOS transistor MN1 are connected in common to an input terminal INN. Gates of the P-channel MOS transistor MP2 and the N-channel MOS transistor MN2 are connected in common to an input terminal INP.

The intermediate stage 220 is the intermediate stage for folded-cascode configuration and includes two floating constant current sources (MN7/MP7 and MN8/MP8).

A drain of the N-channel MOS transistor MN1 of the first differential pair of the input stage 210 is connected to the connection node A between a drain of a P-channel MOS transistor MP3 and a source of a P-channel MOS transistor MP5, in the intermediate stage 220. A drain of the N-channel MOS transistor MN2 is connected to the connecting node B between a drain of a P-channel MOS transistor MP4 and a source of a P-channel MOS transistor MP6, in the intermediate stage 220. A drain of the P-channel MOS transistor MP1 of the second differential pair of the input stage 210 is connected to the connection node C between a drain of an N-channel MOS transistor MN3 and a source of an N-channel MOS transistor MN5, in the intermediate stage 220. A drain of the P-channel MOS transistor MP2 is connected to the connecting node D between a drain of an N-channel MOS transistor MN4 and a source of an N-channel MOS transistor MN6, in the intermediate stage 220.

The P-channel MOS transistors MP3 and MP4 have their drains connected to the nodes A and B, respectively, their sources connected in common to the positive power supply VDD2, and their gates coupled in common.

The P-channel MOS transistor MP5 has a source connected to the node A, and a drain connected to the commonly coupled drains of the P-channel MOS transistors MP3 and MP4, a source of the P-channel MOS transistor MP7, and a drain of the N-channel MOS transistor MN7. The P-channel MOS transistor MP6 has a source connected to the node B, and a drain connected to a source of the P-channel MOS transistor MP8, a drain of the N-channel MOS transistor MN8, and a gate of a P-channel MOS transistor MP9 in the final stage 230. Gates of the P-channel MOS transistors MP5 and MP6 are connected in common to a constant voltage source terminal BP2.

Sources of the N-channel MOS transistors MN3 and MN4 are coupled, while gates of the N-channel MOS transistors MN3 and MN4 are coupled. The commonly coupled sources of the N-channel MOS transistors MN3 and MN4 are connected to the negative power supply VSS2. The drains of the N-channel MOS transistors MN3 and MN4 are connected to the node C and the node D, respectively. The N-channel MOS transistor MN5 has a source connected to the node C, and a drain connected to the commonly coupled gates of the N-channel MOS transistors MN3 and MN4, a source of the N-channel MOS transistor MN7, and a drain of the P-channel MOS transistor MP7. The N-channel MOS transistor NN6 has a source connected to the node D, and a drain connected to a source of the N-channel MOS transistor MN8, a drain of the P-channel MOS transistor MP8, and a gate of an N-channel MOS transistor MN9. Gates of the N-channel MOS transistors MN5 and MN6 are connected in common to a constant voltage source terminal BN2.

The P-channel MOS transistor MP7 has a gate connected to a constant voltage source terminal BP3, a source of the P-channel MOS transistor MP7 connected to the drain of the P-channel MOS transistor MP5, and a drain of the P-channel MOS transistor MP7 connected to the drain of the N-channel MOS transistor MN5.

The N-channel MOS transistor MN7 has a gate connected to a constant voltage source terminal BN3, a source connected to the drain of the N-channel MOS transistor MN5, and a drain connected to the drain of the P-channel MOS transistor MP5. The P-channel MOS transistor MP7 and the N-channel MOS transistor MN7 serve as a floating constant current source.

The P-channel MOS transistor MP8 has a gate connected to a constant voltage source terminal BP4, a source connected to the drain of the P-channel MOS transistor MP6, and a drain connected to the drain of the N-channel MOS transistor MN6.

The N-channel MOS transistor MN8 has a gate connected to a constant voltage source terminal BN4, source connected to the drain of the N-channel MOS transistor MN6, and a drain connected to the drain of the P-channel MOS transistor MP6.

The P-channel MOS transistor MP8 and the N-channel MOS transistor MN8 serve as a floating constant current source.

The final stage 230 is a class-AB output stage controlled by bias voltages BP4 and BN4, and the N-channel MOS transistor MN8/the P-channel MOS transistor MP8.

The P-channel MOS transistor MP9 is an output transistor that has a source connected to the positive power supply VDD2, a gate connected to the source of the P-channel MOS transistor MP8, and a drain connected to an output terminal OUT.

The N-channel MOS transistor MN9 is an output transistor that has a source connected to the negative power supply VSS2, a gate connected to the source of the N-channel MOS transistor MN8, and a drain connected to the output terminal OUT.

One end of a phase compensating capacitor C1 is connected to the node B, while the other end of the phase compensating capacitor C1 is connected to the output terminal OUT. One end of a phase compensating capacitor C2 is connected to the node D, while the other end of the phase compensating capacitor C2 is connected to the output terminal OUT.

In order to realize the rail-to-rail operation, the input stage 210 includes the differential pairs (MP1, MP2) and (MN1, MN2) of mutually opposite conductivity types, and is configured to be of a folded-cascode type. The intermediate stage 220 adds currents of outputs of the P-channel differential pair and the N-channel differential pair of the input stage 210. The intermediate stage 220 constitutes a constant current source circuit that uses the floating current source (refer to Patent Document 3). The floating current source herein includes the N-channel MOS transistor MN7, the P-channel MOS transistor MP7, and the bias terminals BN3 and BP3 that supply the bias voltages (constant voltages) to the gates of the N-channel MOS transistor MN7 and the P-channel MOS transistor MP7, respectively.

In order to realize output rail-to-rail operation, the final stage 230 constitutes a drain output class-AB amplifier. An idling current of this class-AB amplifier is determined by the floating current source (MP8, MN8) and the bias terminals BN4 and BP4.

When an input voltage is low, only the differential pair (MP1, MP2) operates. Conversely, when the input voltage is high, only the differential pair (MN1, MN2) operates. When the input voltage is of an intermediate value between the high and low input voltages, the differential stages (MP1, MP2) and (MN1, MN2) both operate.

That is, in an operation that uses the input voltage closer to the supply voltage VSS2, only the differential stage (MP1, MP2) operates, and the differential pair (MN1, MN2) does not operate. The reason for this is as follows. An enhancement-type N-channel MOS transistor is generally used and in order for the enhancement-type N-channel MOS transistor to operate, there needs to be a voltage of a transistor threshold voltage (VT)+α present between the gate and source of the N-channel MOS transistor.

When the input voltage is around 0V closer to the supply voltage VSS2 of the negative power supply, or a gate voltage of the input differential transistor is around 0V, a source potential of the input differential transistor also becomes around 0V. Accordingly, it can be seen that the differential pair (MN1, MN2) does not operate. When the input voltage is around the supply voltage VDD2 closer to the supply voltage VDD2 of the positive power supply, or the gate voltage of the input differential transistor is around VDD, the source potential of the input differential transistor also becomes around the supply voltage VDD. Accordingly, it can be seen that the differential pair (MP1, MP2) does not operate. When the input voltage is approximately VTN to VDD−VTP (in which VTN indicates a threshold voltage of an N-channel MOS transistor, and VTP indicates a threshold voltage of a P-channel MOS transistor), both of the differential stages (MP1, MP2) and (MN1, MN2) operate.

[Patent Document 1]
U.S. Pat. No. 5,311,145
[Patent Document 2]
JP Patent Kokai Publication No. JP-A-6-326529
[Patent Document 3]
JP Patent Kokoku Publication No. JP-A-6-91379

SUMMARY OF THE DISCLOSURE

In case the conventional operational amplifier shown in FIG. 2 is employed as a drive amplifier for the LCD source driver, offset voltages of the first differential stage (MP1, MP2) and the second differential stage (MN1, MN2) are canceled with respect to an amplitude difference deviation (an amplitude voltage difference between respective amplifiers) at a voltage of an intermediate gray-scale level (of approximately VTN to VDD−VTP). Thus, the operational amplifier exhibits a satisfactory characteristic with respect to the amplitude difference deviation. However, when amplification up to around the supply voltages is performed, the differential pair (MP1, MP2) and the differential pair (MN1, MN2) operate independently (with one differential pair operating, but with the other being inactive). Accordingly, the offset voltages are not canceled. For this reason, the characteristic with respect to the amplitude difference deviation described before may become deteriorated, thereby making it difficult to achieve higher accuracy. There is known a conventional differential amplifier that employs a differential pair of depletion-type N-channel transistors. With this conventional differential amplifier, a threshold voltage is of a minus value and hence an input voltage can be supplied as from a negative power supply voltage to exhibit an excellent characteristic of the amplitude difference deviation. On the other hand, with this conventional differential amplifier, owing to the threshold voltage of a minus value, an input in the vicinity of a positive power supply voltage becomes impossible, as a result of which the rail-to-rail operation cannot be achieved. As described above, there has been not present a differential amplifier that may exhibit an excellent characteristic of the amplitude difference deviation and may achieve the rail-to-rail operation.

In order to solve the problem described above, the invention disclosed in the present application is schematically configured as follows.

A differential amplifier according to the present invention includes a folded-cascode load circuit as an active load of a differential pair that receives an input signal, wherein the differential pair includes a depletion-type transistor.

More specifically, the present invention includes:
a differential pair constituted from depletion-type first and second N-channel MOS transistors;
a first current source that supplies a current to the differential pair;
a current mirror circuit formed by connecting two stages of transistor pairs in cascode, for connecting an output pair of the differential pair in folded connection;
second and third current sources connected to an input terminal of the current mirror circuit and an output terminal of the current mirror circuit, respectively; and
an amplification stage with an input terminal thereof connected to the output terminal of the current mirror circuit and with an output terminal thereof connected to an output terminal of the differential amplifier. In the present invention, threshold voltages of the depletion-type N-channel MOS transistor are set to substantially −0.1V. Preferably, the depletion-type N-channel MOS transistors are diffused with a non-doping method. In the present embodiment, each of the first and second depletion-type N-channel MOS transistors is a depletion-type transistor with a back-gate bias effect and has a back gate applied with a negative supply voltage.

A driver for a display device according to the present invention includes the differential amplifier according to the present invention described above, as an output amplifier that drives a gray scale signal onto a data line, for output, based on an image signal.

The meritorious effects of the present invention are summarized as follows.

According to the present invention, by adopting the depletion-type MOS transistors in an input differential stage, it becomes possible to receive an input voltage as from a negative supply voltage. Further, according to the present invention, a deviation among output amplifiers in a display data driver is improved, thereby allowing achievement of higher accuracy.

Still other features and advantages of the present invention will become readily apparent to those skilled in this art from the following detailed description in conjunction with the accompanying drawings wherein only the preferred embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

DETAILED DESCRIPTION OF THE INVENTION

Figure 1:
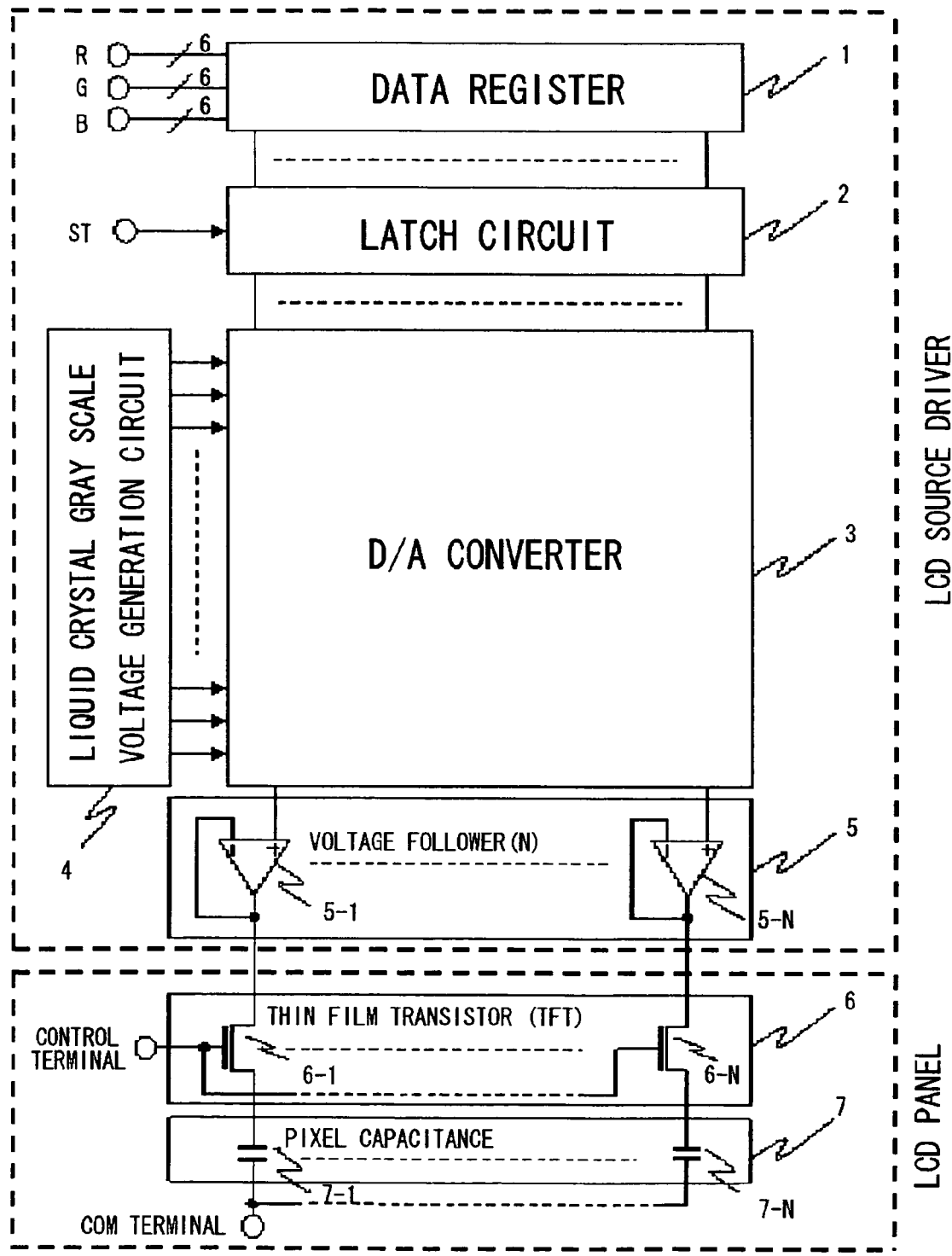
FIG. 1 is a block diagram showing a common liquid crystal display device.

In order to describe the present invention described above in further detail, a description of the exemplary embodiment will be given below with reference to appended drawings. A differential amplifier according to the present invention includes a differential pair (MN1, MN2) constituted from depletion-type N-channel MOS transistors, a constant current source (I1) connected to coupled sources of the differential pair (MN1, MN2), a current mirror circuit (MP1 and MP2, and MP3 and MP4) constituted by cascode connections of two stages, which are for connecting differential outputs of the differential pair (MN1, MN2) in folded connection, second and third constant current sources (12, 13) connected to an input terminal of the current mirror circuit and an output terminal of the current mirror circuit, respectively, and a buffer amplifier (A1) with an input terminal thereof connected to the output terminal of the current mirror circuit and an output terminal thereof connected to an output terminal (OUT) of the differential amplifier.

In the differential amplifier according to the present invention, threshold voltages of the depletion-type N-channel MOS transistors are set to approximately −0.1V (which may be of the order of −0.1V plus or minus 0.1V). According to the present invention, input of an input voltage as from a negative supply voltage becomes possible. The input voltage as from the negative supply voltage can be received by the differential amplifier, and an offset of the differential amplifier can be canceled even in the vicinity of the negative supply voltage. When the differential amplifier is operated at a high voltage of the order of approximately 10V, input of substantially a supply voltage VDD becomes possible due to two effect that a gate-to-source voltage becomes approximately several hundred mV because of a transistor back gate effect and that outputs of an input differential stage are received by the current mirror circuit connected in folded connection.

In the differential amplifier according to the present invention, the current mirror circuit includes:

first and second P-channel MOS transistors (MP1, MP2) which have sources connected in common to a positive power supply terminal VDD and gates coupled together;

third and fourth P-channel MOS transistors (MP3, MP4) which have gates coupled together and sources connected to drains of the first and second P-channel MOS transistors, respectively; and a first voltage source (V1) which is connected between the commonly coupled gates of the third and fourth P-channel MOS transistors and the positive power supply terminal. The commonly coupled gates of the first and second P-channel MOS transistors are connected to a drain of the third P-channel MOS transistor to constitute an input terminal of the current mirror circuit and a drain of the fourth P-channel MOS transistor constitutes an output terminal of the current mirror circuit.

The differential amplifier of the present invention may include:

a third N-channel MOS transistor (MN3) that has a drain connected to a drain of the third P-channel MOS transistor (MP3) and the commonly connected gates of the first and second P-channel MOS transistors (MP1, MP2);

a second constant voltage source (V2) which is connected between a gate of the third N-channel MOS transistor (MN3) and a negative power supply terminal (VSS);

a fourth N-channel MOS transistor (MN4) that has a gate connected to the second constant voltage source (V2) and a drain connected to a drain of the fourth P-channel MOS transistor (MP4);

fifth and sixth N-channel MOS transistors (MN5, MN6) which have sources connected in common to the negative power supply terminal (VSS), gates coupled together, and drains connected to the sources of the third and fourth N-channel MOS transistors (MN3, MN4), respectively;

a seventh N-channel MOS transistor (MN7) that has a gate and a drain connected in common to the gates of the fifth and sixth N-channel MOS transistors (MN5, MN6) and a source connected to the negative power supply terminal (VSS);

a fourth constant current source (14) which is connected between the positive power supply terminal (VDD) and the commonly connected gate and drain of the seventh N-channel MOS transistor (MN7);

a fifth P-channel MOS transistor (MP5) that has a source connected in common to the drains of the fourth N-channel MOS transistor (MN4) and the fourth P-channel MOS transistor (MP4), and a drain connected in common to the source of the fourth N-channel MOS transistor (MN4) and the drain of the sixth N-channel MOS transistor (MN6);

a sixth P-channel MOS transistor (MP6) that has a source connected to the positive power supply terminal (VDD), a gate connected to the drain of the fourth P-channel MOS transistor (MP4), and a drain connected to the output terminal (OUT);

an eighth N-channel MOS transistor (MN8) that has a source connected to the negative power supply terminal (VSS), a gate connected in common to the drain of the sixth N-channel MOS transistor (MN6), and a drain connected to the output terminal (OUT); and a third constant voltage source (V3) which is connected between a gate of the fifth P-channel MOS transistor (MP5) and the positive power supply terminal (VDD).

In the present invention, the second constant current source may include:

a floating current source (15) that has one end connected to the input terminal of the current mirror circuit; and a second current mirror circuit (CM) that has an input terminal connected to the other end of the floating current source and a common terminal connected to the negative power supply terminal (GND). An output of the second current mirror circuit may constitute the third current source.

In the present invention, the buffer amplifier (A1) may include:

a fourth N-channel MOS transistor (MN4) that has a gate connected to the second voltage source (V2) and a drain connected to a drain of the fourth P-channel MOS transistor (MP4);

a fifth P-channel MOS transistor (MP5) that has a source connected in common to the drain of the fourth N-channel MOS transistor (MN4) and the drain of the fourth P-channel MOS transistor (MP4), and has a drain connected in common to a source of the fourth N-channel MOS transistor (MN4) and a drain of the sixth N-channel MOS transistor (MN6);

a sixth P-channel MOS transistor (MP6) which serves as an output transistor, and has a source connected to the positive power supply terminal (VDD), a gate connected in common to the drain of the fourth P-channel MOS transistor (MP4), and a drain connected to the output terminal (OUT);

an eighth N-channel MOS transistor (MN8) which serves as an output transistor, and which has a source connected to the negative power supply terminal (VSS), has a gate connected in common to the drain of the sixth N-channel MOS transistor (MN6), and has a drain connected to the output terminal (OUT); and a third constant voltage source (V3) which is connected between a gate of the fifth P-channel MOS transistor (MP5) and the positive power supply terminal (VDD).

In the present invention, the floating current source may be constituted from:

ninth and tenth N-channel MOS transistors (MN9, MN10) which have gates coupled together;

seventh and eighth P-channel MOS transistors (MP7, MP8) which have gates coupled together;

a fourth constant voltage source (V4) that has a positive side connected in common to a gate of the eighth P-channel MOS transistor (MP8) and a drain of the eighth P-channel MOS transistor (MP8) and has a negative side connected to a GND potential; and a fourth constant current source (14) that has one end connected to the positive power supply terminal (VDD) and the other end connected in common to the gate of the tenth N-channel MOS transistor (MN10) and a drain of the tenth N-channel MOS transistor (MN10). A source of the tenth N-channel MOS transistor (MN10) and a source of the eighth P-channel MOS transistor (MP8) may be coupled together. A source of the ninth N-channel MOS transistor (MN9) and a source of the seventh P-channel MOS transistor (MP7) may be coupled together. A drain of the ninth N-channel MOS transistor (MN9) and a drain of the seventh P-channel MOS transistor (MP7) may constitute output terminals. A description will be given below, in connection with examples.

EXAMPLES

Figure 3:
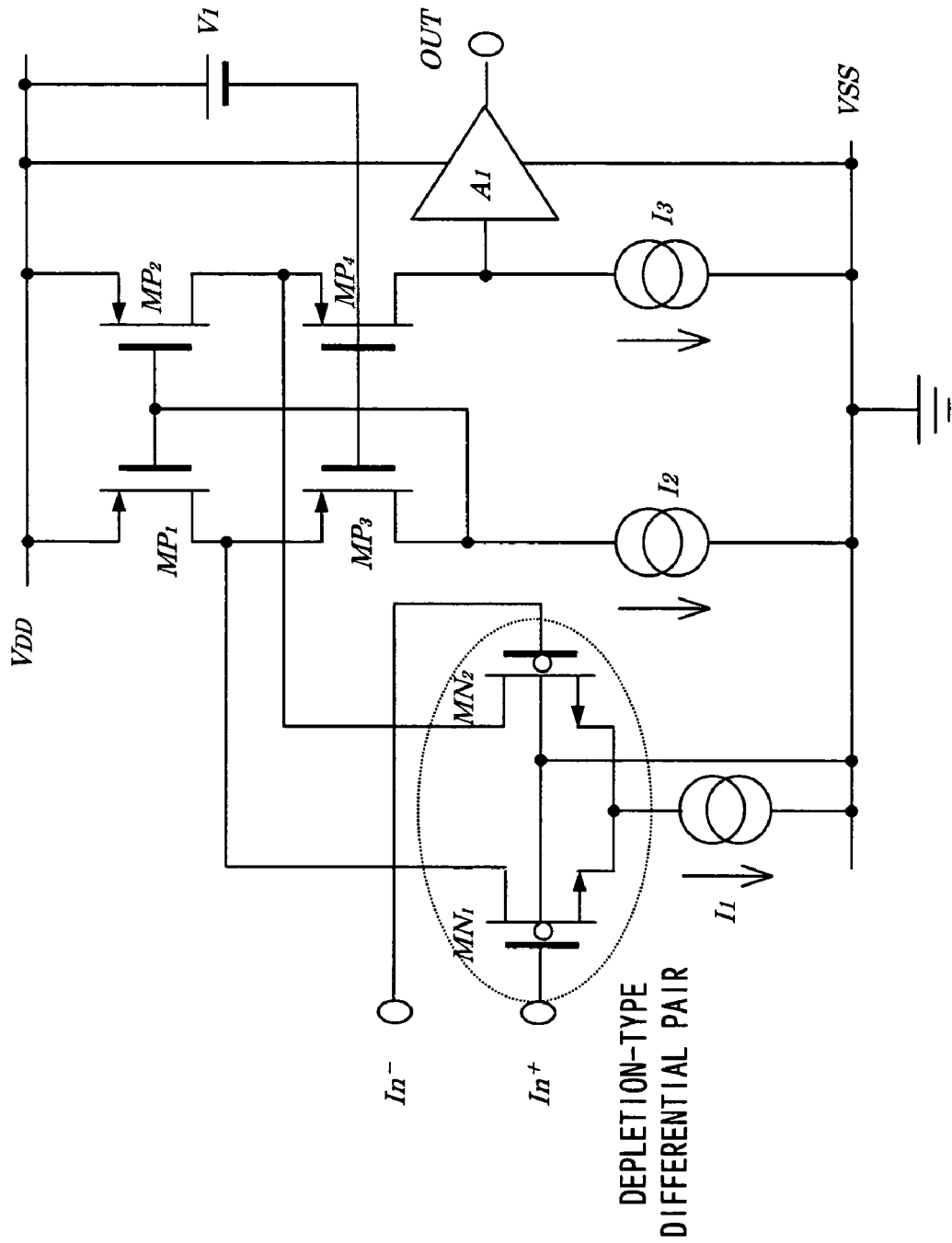
FIG. 3 is a diagram showing a configuration of a first embodiment of the present invention.
Figure 10:
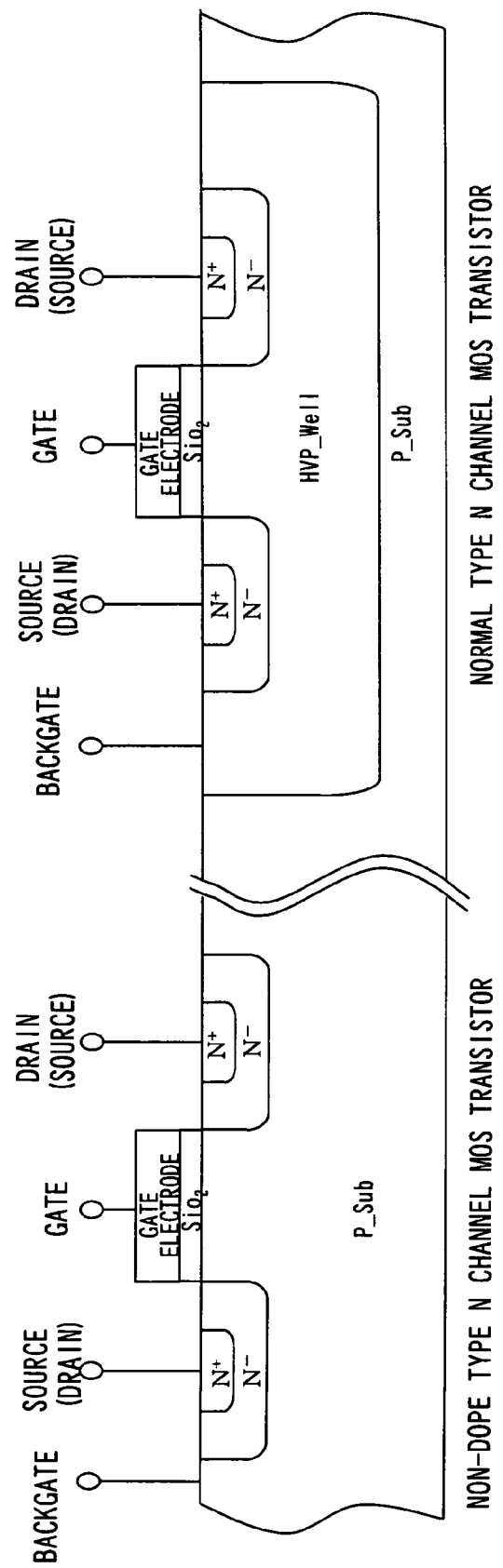
FIG. 10 is a schematic sectional view of a depletion-type N-channel MOS transistor in an embodiment of the present invention.

FIG. 10 is a schematic sectional view of a depletion-type N-channel MOS transistor in an embodiment of the present invention. Referring to FIG. 10, N-type source and drain regions are formed in a P-type semiconductor substrate, while a channel region is not subjected to ion-implantation of P-type impurity (also termed HV (high voltage) P-well) and is held in a substrate impurity concentration (referred to as 'non-dope'). The so formed N-channel MOS transistor exhibits a deletion characteristic, depending on the condition with regard to source impurity and substrate impurity concentration and has a threshold voltage of about −0.1 volt. When an negative power supply voltage is applied to a back gate of the N-channel MOS transistor, the so called back gate effect is obtained. As well known, a the back-gate effect indicate an effect in which a threshold voltage of a MOS transistor is varied in accordance with a potential difference between a source and a back gate of the MOS transistor. When the source potential of a transistor which has a back gate supplied with a negative power supply voltage, rises for example, about 10V, the marked back gate effect is produced and the threshold voltage changes from about −0.1 to about+several volt divided by ten. The negative power supply terminal (VSS) is connected to back gates of other enhancement-type N-channel MOS transistors not shown and a positive power supply terminal (VDD) is to back gates of P-channel MOS transistors not shown. FIG. 3 is a diagram showing an example of a configuration of a differential amplifier according to an embodiment of the present invention. Referring to FIG. 3, the differential amplifier includes depletion-type N-channel MOS transistors MN1 and MN2, current sources I1, I2, and I3, P-channel MOS transistors MP1, MP2, MP3, and MP4, a constant voltage source V1, and a buffer amplifier A1.

The sources of the N-channel MOS transistors MN1 and MN2 are coupled together, and gates of the N-channel MOS transistors MN1 and MN2 are connected to differential input terminals In$^+$ and In$^-$, respectively. The constant current source I1 is connected between the sources of the N-channel MOS transistors MN1 and MN2 connected in common and a negative power supply terminal (VSS). The back gates of the N-channel MOS transistors MN1 and MN2 are connected in common to the negative power supply terminal (VSS).

The sources of the P-channel MOS transistors MP1 and MP2 are connected in common to the positive power supply terminal (VDD), and the gates of the P-channel MOS transistors MP1 and MP2 are coupled together. The gates of the P-channel MOS transistors MP3 and MP4 are coupled together. The source of the P-channel MOS transistor MP3 is connected to the drain of the P-channel MOS transistor MP1. The source of the P-channel MOS transistor MP4 is connected to the drain of the P-channel MOS transistor MP2.

A drain of the N-channel MOS transistor MN1 is connected to a connection node between the drain of the P-channel MOS transistor MP1 and the source of the P-channel MOS transistor MP3.

A drain of the N-channel MOS transistor MN2 is connected to a connection node between the drain of the P-channel MOS transistor MP2 and the source of the P-channel MOS transistor MP4.

The constant voltage source V1 is connected between the commonly coupled gates of the P-channel MOS transistors MP3 and MP4 and the positive power supply terminal (VDD).

One end of the constant current source 12 is connected to the drain of the P-channel MOS transistor MP3 and the commonly coupled gates of the P-channel MOS transistors MP1 and MP2. Other end of the constant current source 12 is connected to the negative power supply terminal VSS.

One end of the constant current source 13 is connected to the drain of the P-channel MOS transistor MP4. Other end of the constant current source 13 is connected to the negative power supply terminal VSS.

An input terminal of the buffer amplifier A1 is connected to the drain of the P-channel MOS transistor MP4, and an output terminal of the buffer amplifier A1 is connected to the output terminal OUT of the differential amplifier.

Referring to FIG. 3, the P-channel MOS transistors MP1, MP2, MP3 and MP4 are arranged in cascode connection with two stages, thereby forming a cascode current mirror circuit.

The commonly coupled gates of the P-channel MOS transistors (MP1, MP2) and the drain of the P-channel MOS transistor MP3 are connected in common, thereby constituting an input terminal of the cascode current mirror circuit. Then, the commonly coupled sources of P-channel MOS transistors (MP1, MP2) becomes a common terminal of the cascode current mirror circuit. The drain of the P-channel MOS transistor (MP4) becomes an output terminal of the cascode current mirror circuit. The cascode current mirror circuit serves as a so-called active load for outputs of a differential stage. In case the cascode current mirror circuit is operated as the ordinary active load, the input and output terminals of this cascode current mirror circuit are employed. In case the cascode mirror circuit is a folded type, the outputs of the differential stage is connected to midway points of the cascoded current mirror circuit constituted by cascode connections, or the respective drains of the P-channel MOS transistors (MP1, MP2). With this arrangement, as will be described below in detail, it becomes possible to extend an input voltage range of the input differential stage.

In order to balance the current mirror circuits, the constant current source (I1) and the constant current source (I2) are set to have the same current value.

The input voltage range of the differential amplifier configured as in FIG. 3 is as from an input voltage of substantially a negative supply voltage to an input voltage of substantially a positive supply voltage. The differential amplifier therefore becomes a circuit capable of performing a so-called rail-to-rail operation.

Referring to FIG. 3, a description will be given about achievement of operation at all input voltages made by combining the differential stage of the N-channel depletion-type MOS transistors with the folded connection.

First, the reason why the rail-to-rail operation can be realized by one differential stage will be described. So-called voltage follower circuit connection is made where the inverting input terminal (In⁻) is connected to the output terminal (OUT), in the circuit in FIG. 3. A voltage input to the non-inverting input terminal (In⁺) is indicated by Vin, a range of a voltage that can be input is given by the following expression (1):

$$V_{DD}-(V_{DS(sat)(MP1/2)}+V_{DS(sat)(MN1/2)}-V_{GS(MN1/2)})>V_{in}>V_{GS(MN1/2)}+V_{DS(sat)(I1)} \quad (1)$$

where $V_{DS(Sat)(MP1/2)}$ indicates a drain-to-source voltage of the P-channel MOS transistors MP1 and MP2 in a saturation region.

$V_{DS(Sat)(MN1/2)}$ indicates a drain-to-source voltage of the N-channel MOS transistors MN1 and MN2 in a saturation region.

$V_{DS(Sat)(I1)}$ indicates a drain-to-source voltage (lowest voltage that operates in a pentode region) of an N-channel MOS transistor constituting the current source I1 in a saturation region.

$V_{GS(MN1/2)}$ indicates a gate-to-source voltage of the N-channel MOS transistors MN1 and MN2.

A MOS transistor gate-to-source voltage $V_{GS}$ is expressed by the following expression (2) in view of a back gate effect:

$$V_{GS} = \sqrt{\frac{2I_D}{\beta}} + V_{TO} + \gamma\sqrt{V_B} \quad (2)$$

$$\beta = \frac{W}{L}\mu C_0, \gamma = \frac{\sqrt{2\varepsilon_0\varepsilon_s qN_A}}{C_0}, C_0 = \frac{\varepsilon_0\varepsilon_s}{t_0}$$

where μ indicates the mobility of carriers, $C_0$ indicates an gate insulator (oxide layer) capacitance per unit area (F/cm²), $\varepsilon_O$ is a dielectric constant in a free space (8.86×10⁻¹⁴ F/cm), $\varepsilon_S$ indicates a semiconductor relative dielectric constant (3.9), q indicates the unit electric charge of an electron (1.6×10⁻¹²Q), and $V_{TO}$ indicates a threshold value at $V_B$=0V.

$I_D$ indicates a drain-to-source current, $V_D$ indicates a drain-to-source voltage, β indicates a transconductance coefficient, γ represents a coefficient indicating a substrate bias effect.

When the input Vin is around 0V, a voltage between the commonly coupled sources of the N-channel MOS transistors MN1 and MN2 and a back gate (a substrate in this case) is the order of 0.1V, and there is almost no back gate effect.

Accordingly, when Expression (2) is substituted into a right side of Expression (1), $V_{GS(MN1/2)}$ becomes approximately −0.1V when $V_{DS(Sat)(I1)}$ is 0.1V. Then, the following relation holds:

$$V_{in}>V_{GS(MN1/2)}+V_{DS(sat)(I1)}=-0.1V+0.1V=0V$$

Then, it can be seen that input voltage as from approximately 0V (VSS) becomes possible.

Next, when an input voltage is around the supply voltage VDD, the voltage between the commonly coupled sources of the N-channel MOS transistors MN1 and MN2 of the differential stage and the back gate becomes closer to approximately VDD.

In the case of an LCD source driver, this VDD becomes 10V or higher, and due to the back gate effect indicated in the third term of Expression (2), the gate-to-source voltage becomes as large as approximately +0.5V. When this value is substituted into a left side of Expression (1), the following expression is obtained:

$$V_{DD}-(V_{DS(sat)(MP1/2)}+V_{DS(sat)(MN1/2)}-V_{GS(MN1/2)})=V_{DD}-(0.1V+0.1V-0.5V)>V_{in}$$

Then, it can be seen that input of the input voltage up to the supply voltage VDD can be performed.

With the aid of the marked back gate effect owing to the increase of the potential difference between a back gate and a source of the transistor, and with outputs of the input stage being connected to the current mirror circuit in so-called folded connection rather than the outputs of the input stage being received by the current mirror circuit that becomes the ordinary active load, the input voltage range even in the differential stage that uses the depletion-type transistors can be extended to the supply voltage VDD.

Referring to FIG. 3, a differential input voltage is converted from differential to single-ended by the current mirror circuit constituted from the P-channel MOS transistors (MP1, MP2, MP3, and MP4), and a signal that has been converted to single-ended is output from the drain of the P-channel MOS transistor MP4. Then, the signal is output to the output terminal OUT via the buffer amplifier A1.

Figure 4:
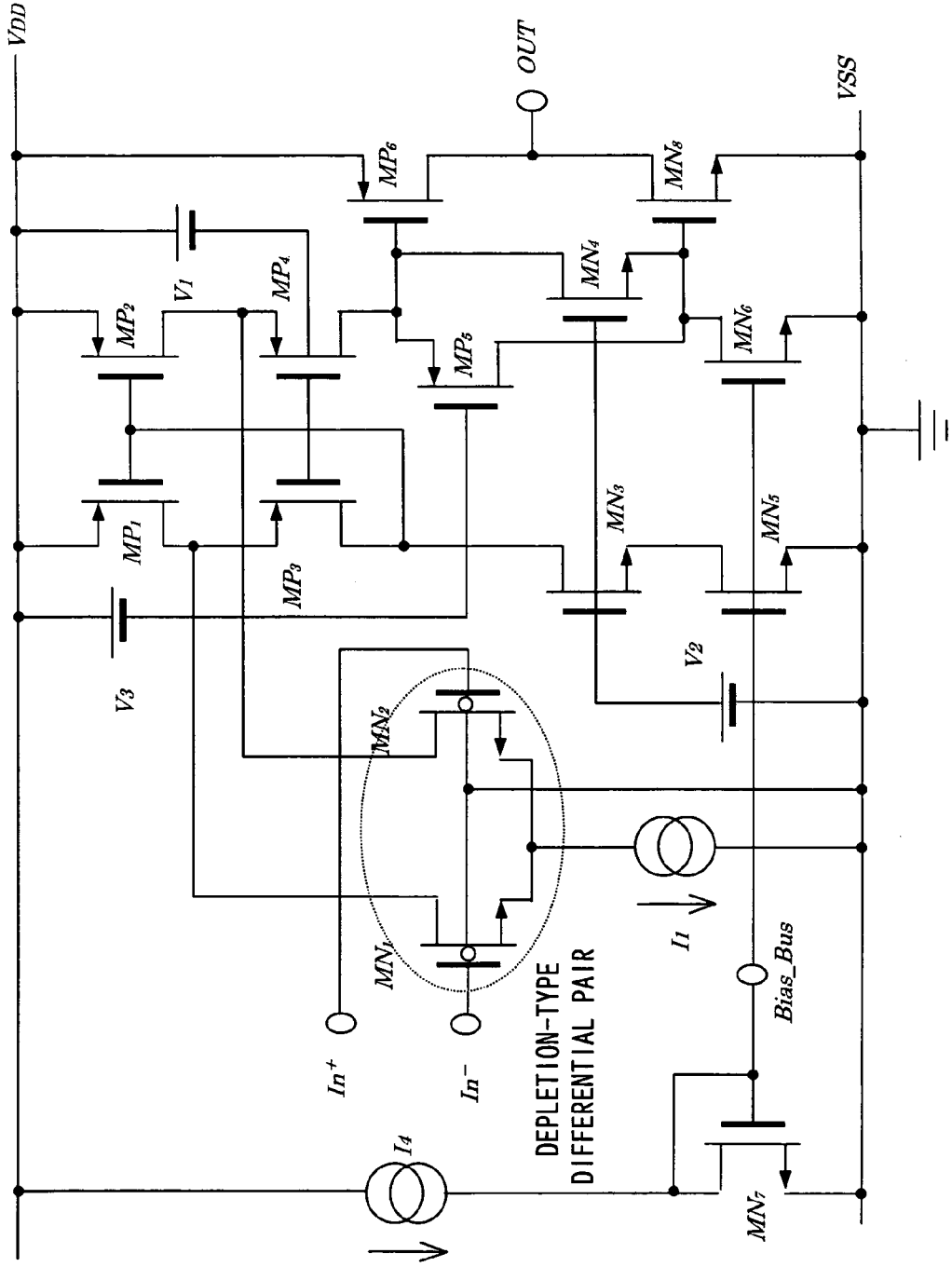
FIG. 4 is a diagram showing a configuration of a second embodiment of the present invention.

Next, a second example of the present invention will be described. FIG. 4 is a diagram showing a configuration of the second example. FIG. 4 is the diagram showing specific examples of the second constant current source 12, third constant current source 13, and buffer amplifier A1, respectively. Referring to FIG. 4, as in the configuration of the example described before, an input differential stage includes the N-channel depletion-type MOS transistors MN1 and MN2 and the constant current source I1. The sources of the N-channel depletion-type MOS transistors MN1 and MN2 are coupled together. The gates of the N-channel depletion type MOS transistors MN1 and MN2 are connected to the terminals In⁻ and IN⁺, respectively. The constant current source I1 is connected between the commonly coupled sources of the N-channel MOS transistors (MN1, MN2) and the negative power supply terminal (VSS). As in the example in FIG. 3 described before, the folded-cascode current mirror circuit is constituted from the P-channel MOS transistors MP1, MP2, MP3, and MP4. The back gates of the N-channel MOS transistors MN1 and MN2 are connected in common to the negative power supply terminal(VSS).

Referring to FIG. 4, in this example, there are provided a current source 14, N-channel MOS transistors MN3, MN4, MN5, MN6, and MN7, and a P-channel MOS transistor MP5, and a P-channel MOS transistor MP6, a N-channel MOS transistor MN8, and the voltage sources V2 and V3 as a circuit that constitutes the buffer amplifier A1.

The drain of the N-channel MOS transistor MN3 is connected to the drain of the transistor MP3 and the commonly coupled gates of the transistors MP1 and MP2. The gate of the N-channel MOS transistor MN3 is connected to the constant voltage source V2.

The N-channel MOS transistor MN5 has a source connected to the negative power supply VSS, and a drain connected to the source of the N-channel MOS transistor MN3.

The P-channel MOS transistor MP5 has a source connected to the drain of the P-channel MOS transistor MP4, and a gate connected to the constant voltage source V3.

The N-channel MOS transistor MN4 has a drain connected to the drain of the P-channel MOS transistor MP4, and a gate connected to the constant voltage source V2.

The N-channel MOS transistor MN6 has a source connected to the negative power supply VSS, a drain connected to the source of the N-channel MOS transistor MN4 and the drain of the P-channel MOS transistor MP5.

The N-channel MOS transistor MN7 has a source connected to the negative power supply VSS, and a gate and drain connected in common to one end of the current source 14. Other end of the current source 14 is connected to the power supply VDD.

The gates of the N-channel MOS transistors MN5 and MN6 are connected in common to the gate of the N-channel MOS transistor MN7.

The P-channel MOS transistor MP6 has a source connected to the power supply VDD, has a gate connected to a common connection node between the drain of the P-channel MOS transistor MP4 and the source of the P-channel MOS transistor MP5, and a common connection node between the drain of the N-channel MOS transistor MN4 and the source of the P-channel MOS transistor MP5, and has a drain connected to the output terminal OUT.

The N-channel MOS transistor MN8 has a source connected to the negative power supply VSS, has a gate connected to a common connection node between the drain of the N-channel MOS transistor MN6 and the drain of the P-channel MOS transistor MP5, and a common connection node between the source of the N-channel MOS transistor MN4 and the drain of the N-channel MOS transistor MN6, and has a drain connected to the output terminal OUT.

A description about the N-channel MOS transistors MN1 and MN2 and the P-channel MOS transistors MP1 to MP4 in FIG. 4 will be omitted.

The N-channel MOS transistors MN5 to MN7 constitute a current mirror circuit of a two-output type. When W/L (channel width/channel length) dimensions of these transistors are the same, a drain current of the N-channel MOS transistor MN5 and a drain current of the N-channel MOS transistor MN6 become the same as a current value of the constant current source 14, respectively.

Then, a drain current of the N-channel MOS transistor MN3 arranged in cascode connection with the N-channel MOS transistor MN5 becomes the same as the drain current of the N-channel MOS transistor MN5. The N-channel MOS transistor MN3 has an effect of not only serving to increase output impedance, but also maintaining drain-to-source voltages of the N-channel MOS transistors MN5 and MN6 to be constant, together with the N-channel MOS transistor MN4, thereby increasing constant current accuracies of these two transistors.

Figure 2:
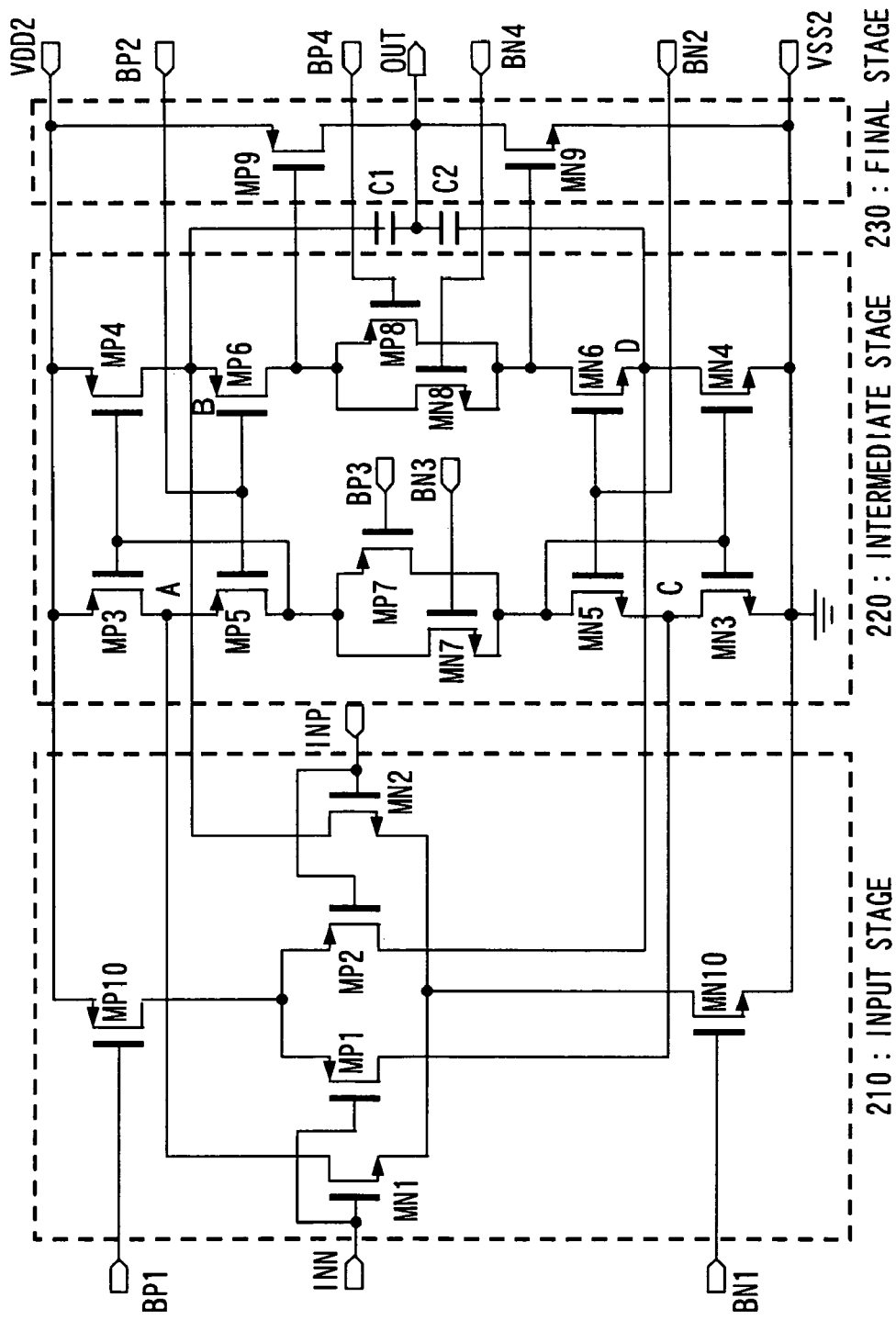
FIG. 2 is a diagram showing a configuration of a conventional operational amplifier circuit.

Like a circuit in FIG. 2, the N-channel MOS transistor MN4 and the P-channel MOS transistor MP5 not only constitute a so-called floating current source (current source capable of freely setting potentials at both ends) but also serve to determine idling currents of the P-channel MOS transistor MP6 and the N-channel MOS transistor MN8 that constitute output transistors, together with the voltage source V1 and the voltage source V2. Details of the floating current source will be described below.

A value of the floating current source is determined as will be described below, in this circuit configuration.

First, since a value of the constant voltage source V3 connected to the gate of the P-channel MOS transistor MP5 is equal to a sum of a gate-to-source voltage $V_{GS(MP5)}$ of the P-channel MOS transistor MP5 and a gate-to-source voltage $V_{GS(MP6)}$ of the P-channel MOS transistor MP6, the following Expression (3) holds:

$$V_3 = V_{GS(MP5)} + V_{GS(MP6)} \qquad (3)$$

(in which $V_{GS(MP5)}$ indicates the gate-to-source voltage of the transistor MP5, while $V_{GS(MP6)}$ indicates the gate-to-source voltage of the transistor MP6).

The gate-to-source voltage $V_{GS}$ of a MOS transistor is given by the following Expression (4) using the drain-to-source current ID, gain coefficient (transconductance) β, and a threshold value VT.

$$V_{GS} = \sqrt{\frac{2I_D}{\beta}} + V_T \qquad (4)$$

in which $$\beta = \frac{W}{L}\mu C_0$$

(in which W indicates a gate width, L indicates a gate length, μ indicates the mobility of carriers, $C_0$ indicates the gate oxide film capacitance per unit area, $V_T$ indicates the threshold voltage, and $I_D$ indicates the drain current).

When the N-channel MOS transistors MN1 and MN2 of the differential pair perform an amplifying operation, drain currents of both of the N-channel MOS transistors MN1 and MN2 are equal. In this case, each of the drain currents becomes ½I.

Generally, bias voltages of the constant voltage sources V2 and V3 are determined so that drain currents of the transistors MP5 and MN4 that constitute the floating current source become equal. When the idling current of the P-channel MOS transistor MP6 in an output stage is indicated by $I_{idle(MP6)}$, the idling current $I_{idle(MP6)}$ satisfies the following Equation (5):

$$V_3 = \sqrt{\frac{I_2}{\beta_{(MP5)}}} + \sqrt{\frac{2I_{idle(MP6)}}{\beta_{(MP6)}}} + 2V_T \qquad (5)$$

(in which $\beta_{(MP5)}$ indicates the transconductance coefficient β of the transistor MP5, while $\beta_{(MP6)}$ indicates the transconductance coefficient β of the transistor MP6.)

Though a detailed circuit of the constant voltage source V3 is not shown, Equation (5) can be solved with respect to $I_{idle(MP6)}$. An actual expression becomes complicated. Thus, a description of the actual expression will be omitted.

Similarly, the constant voltage source V2 connected to the gate of the N-channel MOS transistor MN4 not only makes the respective drain currents of the N-channel MOS transistor MN4 and the P-channel MOS transistor MP5 to be equal, but also sets the constant voltage source V2 so that the idling current of the N-channel MOS transistor MN8 has a desired value.

The floating current source is set as described above.

By constituting the constant voltage sources V3 and V2 using two MOS transistors and a constant current source, respectively, for example, the constant voltage sources V3 and V2 become resistant to a fluctuation caused by a device variation.

The reason for this is that, since a term of "2VT" is generated in an expression of V3, which is a left side of Expression (5), this term is cancelled out between the left side and a right side.

Next, the constant voltage source V1 will be described. The constant voltage source V1 supplies a bias voltage to gates of the P-channel MOS transistors (MP3, MP4). The P-channel MOS transistors (MP1, MP3) are cascoded, and a drain voltage of the P-channel MOS transistor MP3 is VDD−$V_{GS(MP1)}$ ($V_{GS(MP1)}$ is a gate-to-source voltage of the transistor MP1). That is, even if a source-to-drain voltage of the P-channel MOS transistor MP1 is added to a source-to-drain voltage of the P-channel MOS transistor MP3, the added voltage just corresponds to the gate-to-source voltage of the first P-channel MOS transistor (MP1). Thus, it is necessary to set the constant voltage source V1 so that all of the P-channel MOS transistors MP1 to MP4 are operated in the pentode region (saturation region) in such a situation.

As intuitive understanding, the constant voltage source V1 should be set such that the source-to-drain voltage of the P-channel MOS transistor MP1 becomes equal to the source-to-drain voltage of the P-channel MOS transistor MP3, or each of the source-to-drain voltages of the P-channel MOS transistors MP1 and MP3 becomes $V_{GS(MP1)}/2$.

Figure 5:
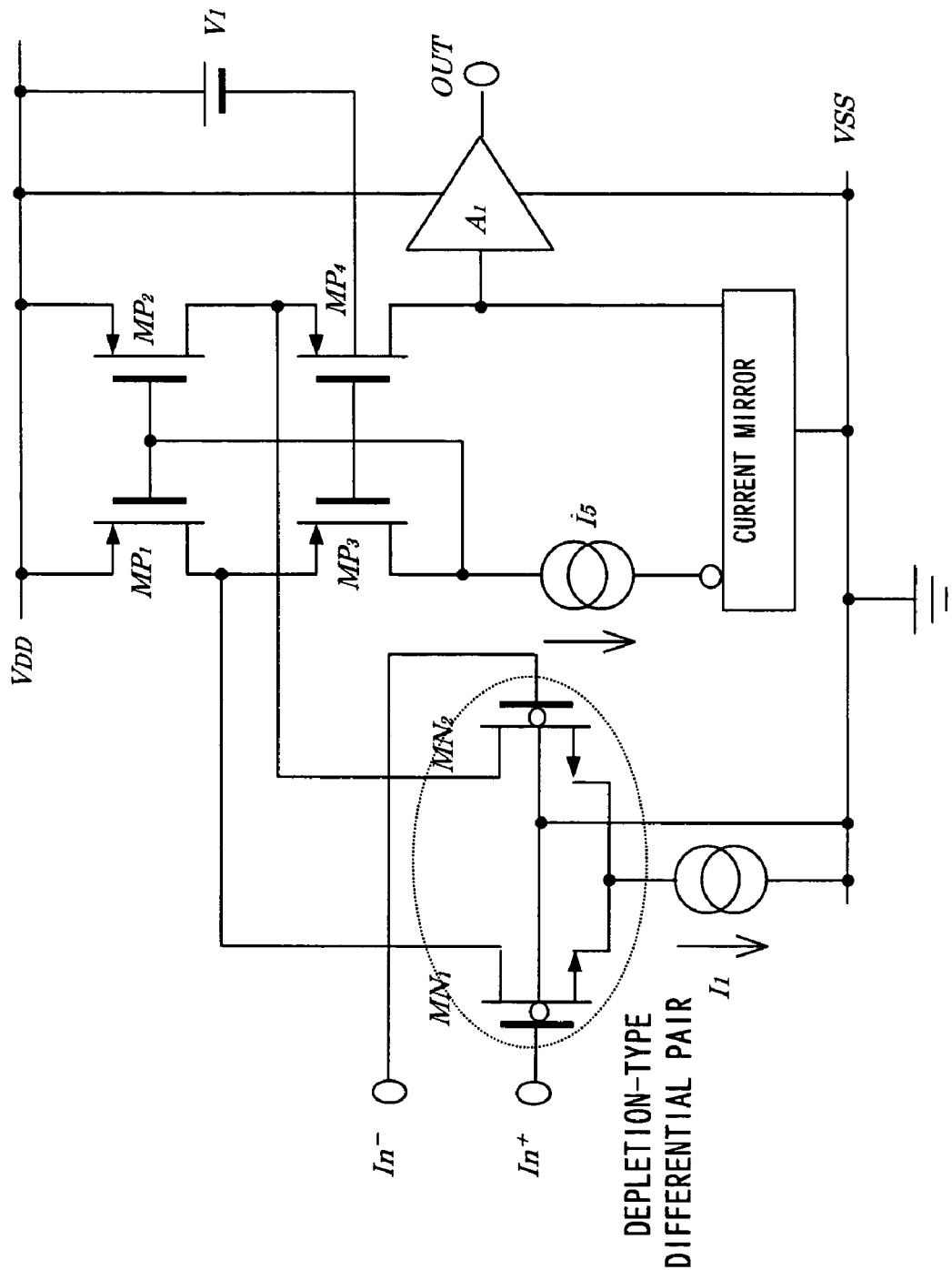
FIG. 5 is a diagram showing a configuration of a third embodiment of the present invention.

FIG. 5 is a diagram showing another examples of configurations of the constant current sources I2 and I3 in the embodiment shown in FIG. 3, respectively. Since the constant current sources I2 and I3 need the same current value, a floating-type constant current source I5 and a second current mirror circuit are employed as these constant current sources. Referring to FIG. 5, same reference characters are assigned to elements that are the same as those in FIG. 3, and a description about the same elements will be omitted.

The constant current source I2 in FIG. 3 is replaced by the floating-type constant current source I5 and the second current mirror circuit with a common terminal thereof connected to GND and an input terminal thereof connected to one end of the floating-type constant current source I5 is added.

Since an output terminal of the second current mirror circuit serves as the current source I3 in FIG. 3, an output of the second current mirror circuit is connected in place of the third constant current source I3.

Since a basic operation as a differential amplifier is the same as the circuit in FIG. 3, a description about the operation of the differential amplifier will be omitted. In the configuration in FIG. 5, the two constant current sources I2 and I3 that need the same current value in the configuration in FIG. 3 are constituted from the floating current source I5 and the second current mirror circuit.

Since the floating-type fifth constant current source I5 is connected to an input terminal of the second current mirror circuit, an output current of the second current mirror circuit also serves as a constant current source having the same current value. Consequently, the fifth current source I5 and an output of the second current mirror circuit correspond to the two constant current sources having the same current value, respectively.

Figure 6:
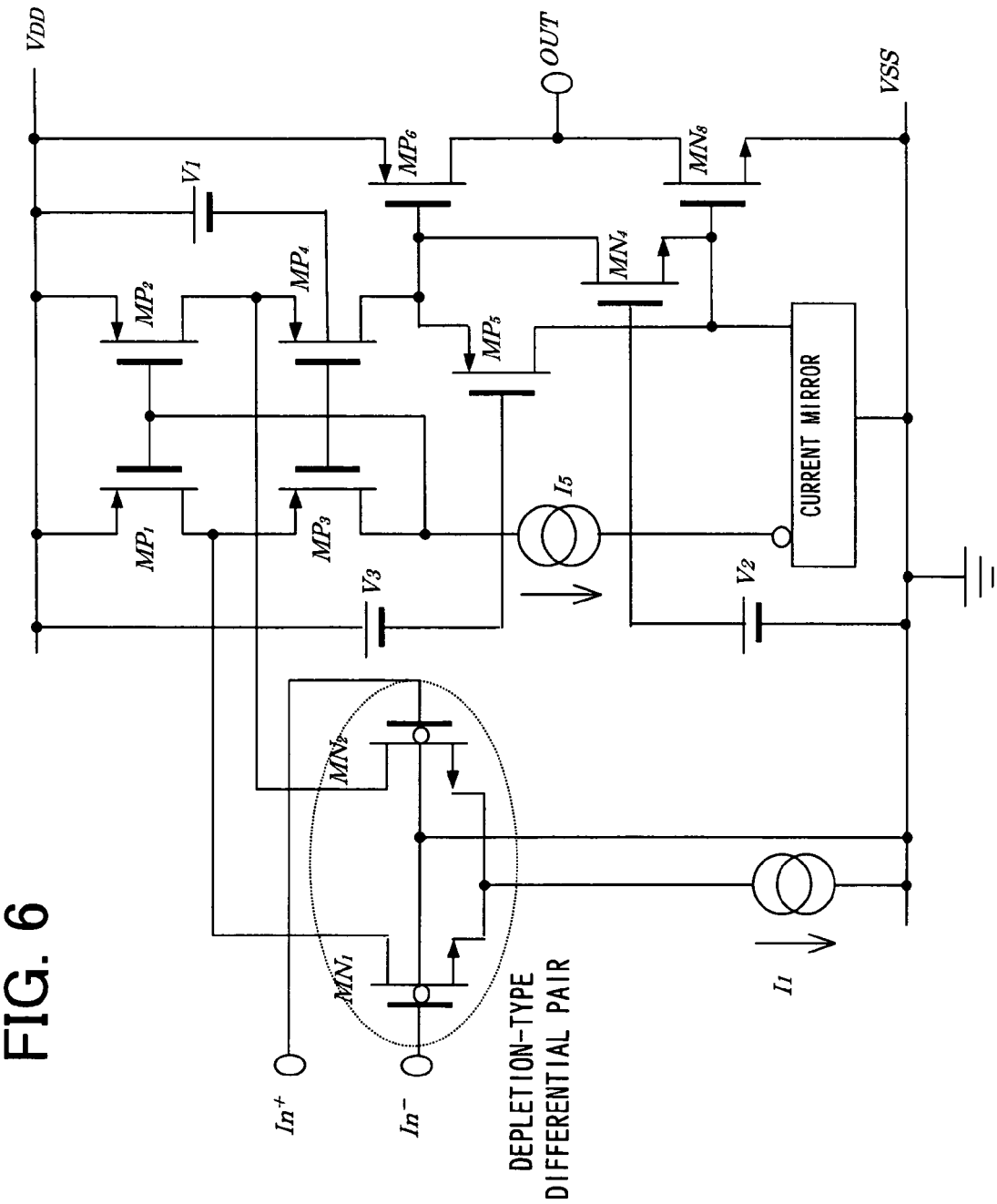
FIG. 6 is a diagram showing a configuration of a fourth embodiment of the present invention.

FIG. 6 is a diagram showing a specific configuration of a buffer amplifier (A1) in FIG. 5. The buffer amplifier (A1) has the same configuration as a configuration (constituted from the transistors MP6 and MN8) shown in FIG. 4.

Figure 7:
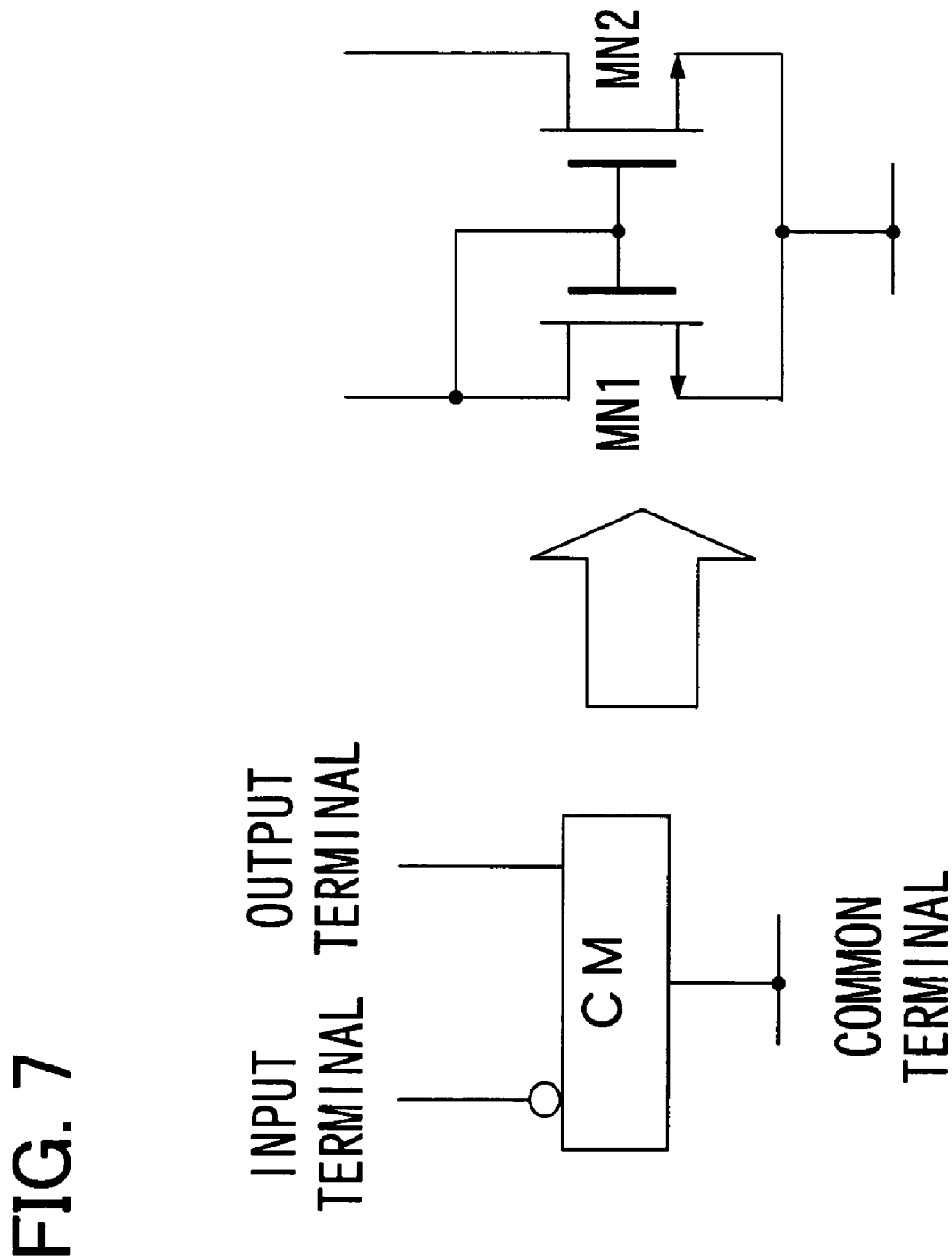
FIG. 7 is a diagram showing a configuration of a current mirror circuit in FIGS. 5 and 6.

FIG. 7 is a diagram showing an example of a specific circuit configuration of the current mirror circuit in FIGS. 5 and 6 when the current mirror circuit is constituted from MOS transistors. As a typical circuit configuration of the current mirror circuit, a Widlar type is famous. Sources of two MOS transistors are connected in common, thereby forming a common terminal of the current mirror circuit. Gates of the two MOS transistors are connected. A drain of one of the two MOS transistors is connected to the commonly coupled gates, thereby forming an input terminal of the current mirror circuit. A drain of the other of the two MOS transistors is set to an output terminal of the current mirror circuit. Meanwhile, the current mirror circuit having other configuration may be of course employed.

Figure 8:
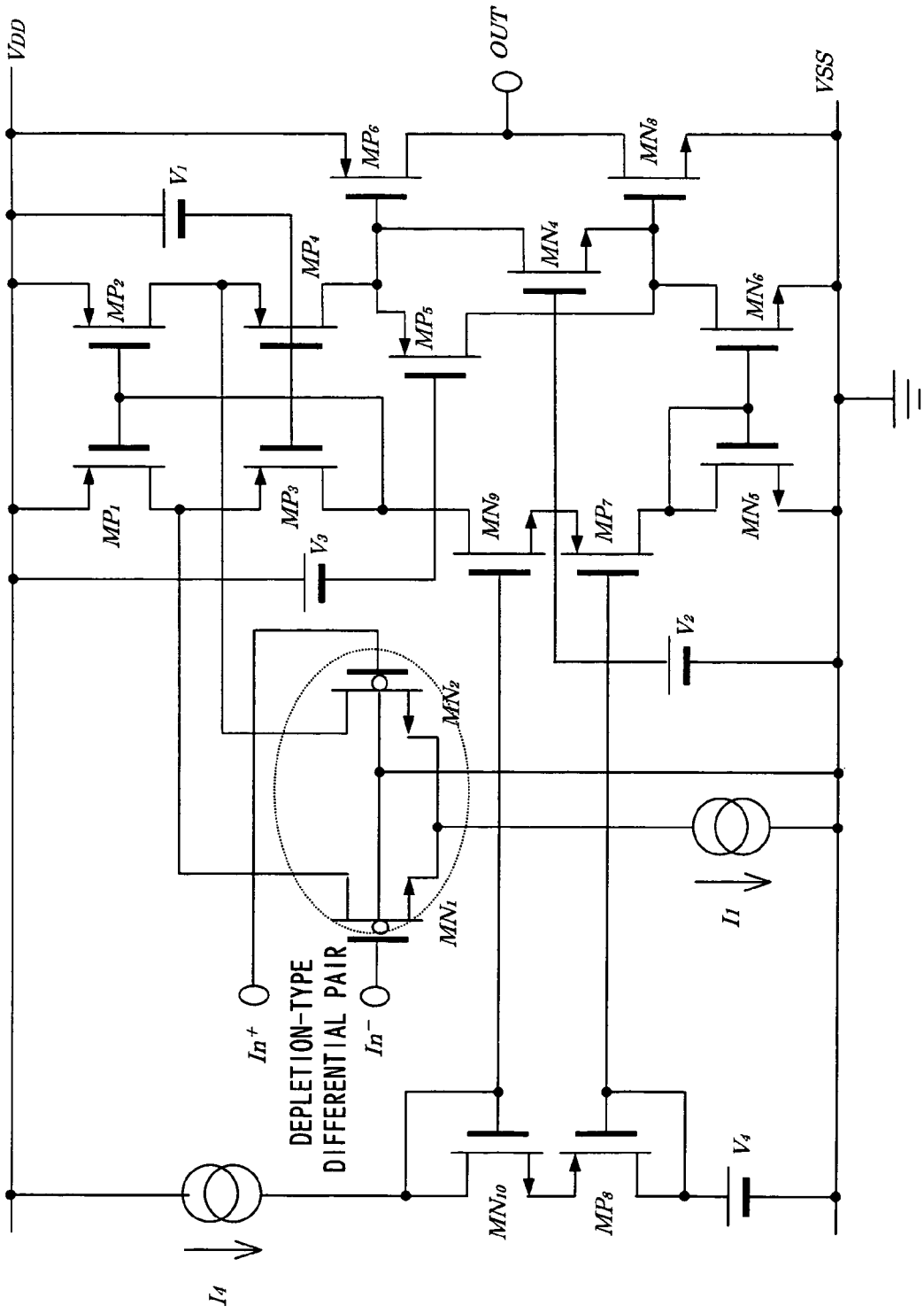
FIG. 8 is a diagram showing a configuration of a fifth embodiment of the present invention.

FIG. 8 is a diagram showing an example of a specific circuit configuration of the floating-type constant current source 15 in FIG. 6 when the floating-type constant current source is constituted from MOS transistors. Since the configuration is the same as in FIG. 6 except for the floating-type constant current source 15, a description about the configuration will be omitted. The floating-type constant current source is constituted from the N-channel MOS transistors MN9 and MN10 with the gates thereof coupled together, the P-channel MOS transistors MP7 and MP8 with the gates thereof coupled together, the constant voltage source V4 with the positive side thereof connected in common to the gate of the P-channel MOS transistor MP8 and the drain of the P-channel MOS transistor MP8 and with the negative side thereof connected to the GND potential, and the constant current source 14 with the one end connected to the positive power supply terminal VDD and with the other end connected in common to the gate of the N-channel MOS transistor MN10 and the drain of the N-channel MOS transistor MN10. The sources of the N-channel MOS transistor MN10 and the P-channel MOS transistor MP8 are coupled together. The sources of the N-channel MOS transistor MN9 and the P-channel MOS transistor MP7 are coupled together. The drains of the N-channel MOS transistor MN9 and the P-channel MOS transistor MP7 become the output terminals, respectively.

Basically, a drain current and a source current are equal in an MOS transistor. Strictly speaking, there are some modes in which depending on a gate-to-source voltage, part of current leaks from a drain to a substrate.

Accordingly, the N-channel MOS transistor MN10 and the P-channel MOS transistor MP8 connected in series operate on the same drain current, respectively. That is, a current value (=I4) of the constant current source I4 becomes a drain current of each of the MOS transistors.

Likewise, drain currents of the N-channel MOS transistor MN9 and the P-channel MOS transistor MP7 connected in series are equal. The constant voltage source V4 herein supplies a bias voltage that determines operating voltages of the P-channel MOS transistor MP7 and the N-channel MOS transistor MN9. Most preferably, a voltage V4 is determined so that a source potential of the P-channel MOS transistor MP7 becomes exactly VDD/2. It is assumed that the N-channel MOS transistor MN9 and the N-channel MOS transistor MN10 are formed with the same W/L dimension, and the P-channel MOS transistor MP7 and the P-channel MOS transistor MP8 are formed with the same W/L dimension.

A sum of a gate-to-source voltage of the P-channel MOS transistor MP7 ($V_{GS(MP7)}$) and a gate-to-source voltage of the N-channel MOS transistor MN9 ($V_{GS(MN9)}$) becomes equal to a sum of a gate-to-source voltage of the P-channel MOS transistor MP8($V_{GS(MP8)}$) and a gate-to-source voltage of the N-channel MOS transistor MN10 ($V_{GS(MN10)}$).

The relationship is expressed by the following expression:

$$V_{GS(MP1)} + V_{GS(MN9)} = V_{GS(MP8)} + V_{GS(MN10)}$$

In the above expression, the gate-to-source voltage $V_{GS}$ of each MOS transistor can be expressed by Expression (4) as described before.

Then, since a drain current $I_{D(MN9)}$ of the N-channel MOS transistor MN9 is equal to a drain current $I_{D(MP7)}$ of the P-channel MOS transistor (MP7), the following expression holds as a result:

$$I_{D(MN9)} = I_{D(MP7)} = I_4$$

Then, the floating-type constant current source can be implemented.

Figure 9B:
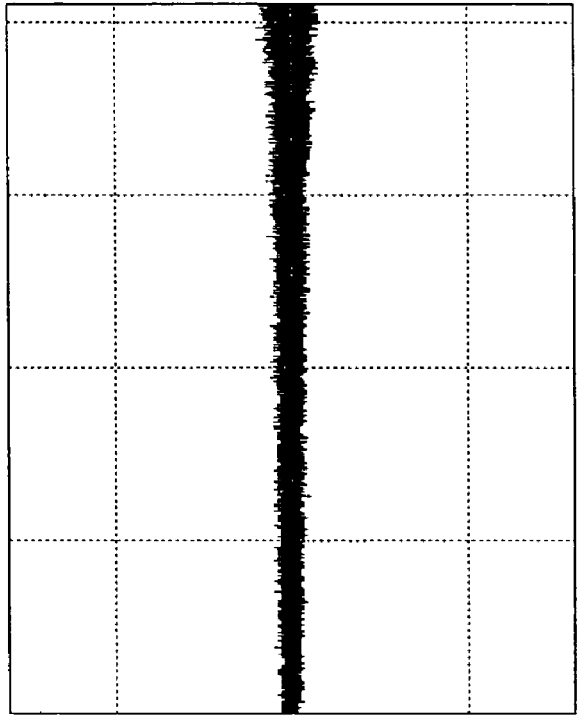
FIGS. 9A and 9B are graphs respectively showing amplitude difference deviation characteristics when a differential amplifier using a conventional circuit and a differential amplifier of the present invention have been used.
Figure 9A:
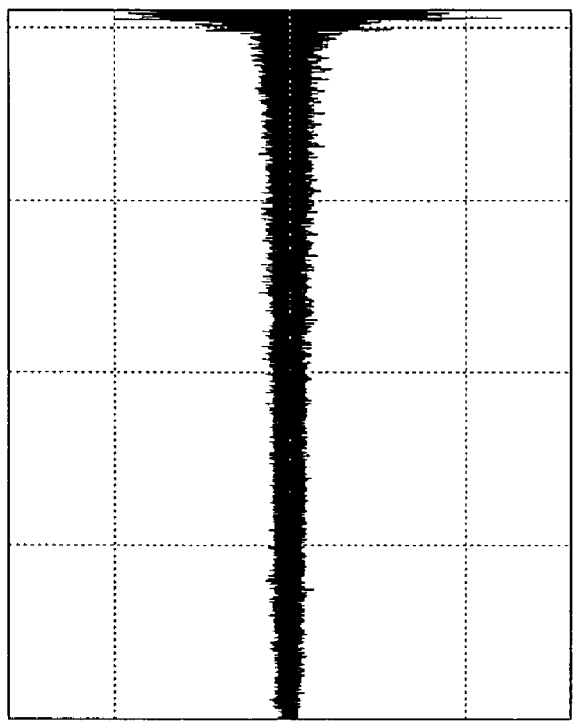

FIGS. 9A and 9B are graphs showing a comparison between an amplitude difference deviation of an LCD source driver using a conventional circuit and an amplitude difference deviation in case the differential amplifier of the present invention has been applied to the LCD driver. A horizontal axis indicates a gray scale. When the gray scale is expressed in terms of voltage, a leftmost side of the horizontal axis indicates ½ VDD potential, while a rightmost side of the horizontal axis indicates the voltage at an amplitude between GND and VDD. A vertical axis indicates an amplitude difference deviation value, and indicates a better characteristic the smaller a band marked out in black is. It can be seen from the amplitude difference deviation of the conventional circuit in FIG. 9A, that the deviation deteriorates at the voltage in the vicinity of the power supply (corresponds to a right side of the graph). On contrast therewith, it can be seen from FIG. 9B that the deviation at the voltage in the vicinity of the power supply is dramatically improved more than in FIG. 9A.

The differential amplifier of the present invention employs the depletion-type N-channel transistors for the differential pair, and employs the load circuit of the folded type as an active load on the differential pair. The circuit that can realize the rail-to-rail operation can be thereby provided.

With this arrangement, when the differential amplifier is used as a drive amplifier for an LCD source driver, a characteristic with respect to the amplitude difference deviation in the vicinity of the power supply in particular can be dramatically improved. The present inventors have ascertained that the conventional differential amplifier which includes a differential pair of N-channel MOS transistors and a differential pair of P-channel MOS transistors, operates differently between a middle level voltage and a voltage swung close to a power supply to generate an amplitude difference deviation. The present invention that includes depletion-type N-channel MOS transistors as a differential pair and a folded cascade type load circuit as a load circuit of the differential pair, may suitably be adopted as for example, a driver amplifier of a LCD source driver to achieve a marked improvement of a characteristic of the amplitude difference deviation in the vicinity of the power supply voltage and to achieve provide a rail-to-rail-operation.

The present invention was described in connection with the embodiments described above. The present invention, however, is not limited to the configurations of the embodiments described above, and of course includes various variations and modifications that could be made by those skilled in the art within the scope of the present invention. Although in the above described embodiments, the back gate effect is explained for a case wherein the back gate of a depletion-type N-channel MOS transistor is connected to the negative power supply terminal (VSS), a constant voltage may well be applied between the back gate and the negative power supply terminal (VSS), because it is only necessary for the depletion-type N-channel MOS transistor to have a back gate effect. It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A differential amplifier comprising:
    a differential pair that includes a first N-channel MOS transistor and a second N-channel MOS transistor, each of said first and second N-channel transistors being a depletion type transistor, each said depletion-type transistor having a threshold voltage that is predetermined to permit an offset voltage of said differential amplifier to be canceled even when said input signal is in a vicinity of a supply voltage;
    a first current source that supplies a current to said differential pair;
    a current mirror circuit that includes plural stages of transistor pairs coupled in cascode fashion for setting an output pair of said differential pair in folded connection;
    a second current source and a third current source connected to an input terminal of said current mirror circuit and an output terminal of said current mirror circuit, respectively; and
    an amplification stage that has an input terminal connected to said output terminal of said current mirror circuit and has an output terminal connected to an output terminal of said differential amplifier.

2. The differential amplifier according to claim 1, wherein each of the depletion-type first and second N-channel MOS transistors comprises a depletion-type transistor with a back-gate bias effect, wherein the threshold voltage of said depletion-type transistors varies in accordance with a potential difference between a source and a back gate of said depletion-type transistors, said back-gate bias thereby permitting said differential amplifier to receive inputs of substantially a power supply voltage.

3. The differential amplifier according to claim 2 wherein threshold voltages of said depletion-type first and second N-channel MOS transistors are set to −0.1V.

4. The differential amplifier according to claim 2 wherein threshold voltages of said depletion-type first and second N-channel MOS transistors are set to −0.1V plus or minus 0.1V.

5. The differential amplifier according to claim 2, wherein said current mirror circuit comprises:
    first and second P-channel MOS transistors which have sources connected in common to a positive power supply terminal and have gates commonly coupled together;
    third and fourth P-channel MOS transistors which have gates commonly coupled together and have sources connected to drains of said first and second P-channel MOS transistors, respectively; and a first voltage source connected between the commonly coupled gates of said third and fourth P-channel MOS transistors and said positive power supply terminal;

wherein the commonly coupled gates of said first and second P-channel MOS transistors are connected to a drain of said third P-channel MOS transistor to constitute said input terminal of said current mirror circuit and a drain of said fourth P-channel MOS transistor constitutes said output terminal of said current mirror circuit.

6. The differential amplifier according to claim 2, comprising:
first and second P-channel MOS transistors which have sources connected in common to a positive power supply terminal and have gates coupled together;
third and fourth P-channel MOS transistors which have gates coupled together and have sources connected to drains of said first and second P-channel MOS transistors, respectively;
a first voltage source connected between the commonly coupled gates of said third and fourth P-channel MOS transistors and said positive power supply terminal;
a third N-channel MOS transistor that has a drain connected in common to a drain of said third P-channel MOS transistor and said commonly coupled gates of said first and second P-channel MOS transistors;
a second voltage source connected between a gate of said third N-channel MOS transistor and a negative power supply terminal;
a fourth N-channel MOS transistor that has a gate connected to said second voltage source and has a drain connected to a drain of said fourth P-channel MOS transistor;
fifth and sixth N-channel MOS transistors which have sources connected in common to said negative power supply terminal, have gates coupled together, and have drains connected to the sources of said third and fourth N-channel MOS transistors, respectively;
a seventh N-channel MOS transistor that has a gate and a drain connected in common to the commonly coupled gates of said fifth and sixth N-channel MOS transistors and has a source connected to said negative power supply terminal;
a fourth current source connected between said positive power supply terminal and a connection node of the gate of said seventh N-channel MOS transistor and the drain of said seventh N-channel MOS transistor;
a fifth P-channel MOS transistor that has a source connected in common to the drains of said fourth N-channel MOS transistor and said fourth P-channel MOS transistor and has a drain connected in common to the source of said fourth N-channel MOS transistor and the drain of said sixth N-channel MOS transistor;
a sixth P-channel MOS transistor that has a source connected to said positive power supply terminal, has a gate connected to the drain of said fourth P-channel MOS transistor, and has a drain connected to said output terminal;
an eighth N-channel MOS transistor that has a source connected to said negative power supply terminal, has a gate connected in common to the drain of said sixth N-channel MOS transistor, and has a drain connected to said output terminal; and
a third voltage source connected between a gate of said fifth P-channel MOS transistor and said positive power supply terminal.

7. The differential amplifier according to claim 2, wherein said second current source comprises:

a floating current source that has one end connected to said input terminal of said current mirror circuit; and another current mirror circuit that has an input end connected to the other end of said floating current source and a common terminals connected to a negative power supply terminal, an output of said another current mirror circuit constituting said third current source.

8. The differential amplifier circuit according to claim 5, wherein said second and third current sources include fifth and sixth N-channel MOS transistors, respectively, said fifth and sixth N-channel MOS transistors having sources connected in common to a negative power supply and having gates coupled together for being supplied with a common bias; and wherein said amplification stage includes:
a fourth N-channel MOS transistor that has a gate connected to a second voltage source and a drain connected to a drain of said fourth P-channel MOS transistor;
a fifth P-channel MOS transistor that has a source connected in common to the drain of said fourth N-channel MOS transistor and the drain of said fourth P-channel MOS transistor, and has a drain connected in common to a source of said fourth N-channel MOS transistor and a drain of said sixth N-channel MOS transistor;
a sixth P-channel MOS transistor that has a source connected to a positive power supply terminal, has a gate connected to the drain of said fourth P-channel MOS transistor, and has a drain connected to said output terminal;
an eighth N-channel MOS transistor that has a source connected to said negative power supply terminal, has a gate connected in common to the drain of said sixth N-channel MOS transistor, and has a drain connected to said output terminal; and
a third voltage source connected between a gate of said fifth P-channel MOS transistor and said positive power supply terminal.

9. The differential amplifier according to claim 7, wherein said floating current source comprises:
ninth and tenth N-channel MOS transistors which have gates coupled together;
seventh and eighth P-channel MOS transistors which have gates coupled together;
a fourth voltage source that has a positive side connected in common to a gate of said eighth P-channel MOS transistor and a drain of said eighth P-channel MOS transistor and has a negative side connected to said negative power supply terminal; and
a fourth current source that has one end connected to said positive power supply terminal and the other end connected in common to the gate of said tenth N-channel MOS transistor and a drain of said tenth N-channel MOS transistor,
wherein a source of said tenth N-channel MOS transistor and a source of said eighth P-channel MOS transistor are coupled together,
a source of said ninth N-channel MOS transistor and a source of said seventh P-channel MOS transistor are coupled together, and
a drain of said ninth N-channel MOS transistor constitutes said one end of said floating current source and a drain of said seventh P-channel MOS transistor constitutes the other end of said floating current source.

10. The differential amplifier according to claim 1, wherein said differential pair has a threshold voltage of a negative voltage corresponding to a terminal voltage across said first current source.

11. The differential amplifier according to claim 1, wherein said differential pair has a threshold voltage of a negative voltage corresponding to a voltage between a negative power supply voltage and coupled sources of said first and second N-channel MOS transistors.

12. The differential amplifier according to claim 1, wherein said depletion-type transistor is formed by a non-doping method.

13. A data driver for a display device comprising the differential amplifier as set forth in claim 1 as a driving circuit for driving a data line.

14. A display device comprising said data driver according to claim 13.

15. The differential amplifier of claim 1, wherein the folded-cascode load circuit is respectively coupled to drains of respective ones of the depletion-type transistors.

16. The differential amplifier of claim 1, wherein drains of said depletion-type transistors are respectively connected to two nodes of the folded-cascode load circuit.

17. A data driver for a display device comprising the differential amplifier as set forth in claim 1 as a driving circuit for driving a data line.

18. A display device comprising said data driver according to claim 17.

19. The differential amplifier of claim 1, wherein said current mirror circuit comprises:
   first and second P-channel MOS transistors interconnected serially, wherein a drain of said second P-channel MOS transistor is connected to a gate of said first P-channel MOS transistor and to said second current source; and
   third and fourth P-channel MOS transistors interconnected serially, wherein a drain of said fourth P-channel MOS transistor is connected to said third current source and a gate of said third P-channel MOS transistor is connected to the gate of said first P-channel MOS transistor,
   wherein a gate of said second P-channel MOS transistor is connected to a gate of said fourth P-channel MOS transistor and to a bias voltage,
   wherein a drain of said first P-channel MOS transistor is connected to a source of said second P-channel MOS transistor and to a drain of said first N-channel MOS transistor of said differential pair, and
   wherein a drain of said third P-channel MOS transistor is connected to a source of said fourth P-channel MOS transistor and to a drain of said second N-channel MOS transistor of said differential pair.

* * * * *